United States Patent [19]

Kelly et al.

[11] 4,257,821
[45] Mar. 24, 1981

[54] UNIVERSAL SOLAR CELL/CONDUCTOR JUNCTION ELEMENT AND SOLAR PANEL EMBODYING SAME

[75] Inventors: Franklin G. Kelly, Long Beach; Saul Bashin, Sepulveda; Robert E. Kennedy, Lawndale, all of Calif.

[73] Assignee: TRW Inc., Redondo Beach, Calif.

[21] Appl. No.: 960,318

[22] Filed: Nov. 13, 1978

[51] Int. Cl.$^2$ ............................................. H01L 31/04
[52] U.S. Cl. ................................ 136/244; 339/17 LC; 339/242
[58] Field of Search ................... 136/89 P, 89 SA; 244/173; 429/121; 339/17 C, 17 R, 17 LC, 242

[56] References Cited

U.S. PATENT DOCUMENTS

| | | | |
|---|---|---|---|
| 2,946,976 | 7/1960 | Blain | 339/17 |
| 3,048,812 | 8/1962 | Heidler | 339/252 |
| 3,466,198 | 9/1969 | Webb et al. | 136/89 |
| 3,562,020 | 2/1971 | Blevins | 136/89 |
| 3,565,719 | 2/1971 | Webb et al. | 156/212 |

Primary Examiner—Aaron Weisstuch
Attorney, Agent, or Firm—Donald R. Nyhagen; John J. Connors

[57] ABSTRACT

A solar electric power generating panel (solar panel) includes one or more universal electrical junction elements of approximately the same size and shape as conventional solar cells mounted along with the cells on a solar array substrate at any selected cell position or positions of the cell array. Each junction element has terminals which may be electrically connected to interconnects of the solar cells and electrical conductors such as lead wires of the cell array in such a way as to condition the element to serve as a series string termination with or without blocking diodes, an electrical voltage tap with or without blocking diodes, or a mounting for cell shunting diodes. Automatic assembly tooling may be utilized to assemble and electrically connect the solar cells, conductors, and junction elements into a completed solar array.

30 Claims, 8 Drawing Figures

UNIVERSAL SOLAR CELL/CONDUCTOR JUNCTION ELEMENT AND SOLAR PANEL EMBODYING SAME

BACKGROUND OF THE INVENTION

A conventional spacecraft solar array panel has a multiplicity of solar cells mounted on a substrate and electrically interconnected in series strings and parallel string groups with the strings and groups physically and electrically arranged in a manner which is custom designed for each application depending upon such factors as the substrate dimensions, the electrical requirements of the completed solar array, and the requirements for electrical taps and protective blocking and shunting diodes in the array. Fabricating such a solar array panel involves three basic difficulties to which this invention is addressed. These difficulties are (1) properly making the large number of electrical connections between the solar cells and other circuit conductors which are normally required in a solar panel, (2) physically accommodating the electrical taps, blocking diodes, and/or shunting diodes of the array, and (3) achieving the required solar cell packing density necessary to satisfy the electrical power requirements of the completed solar array.

Concerning item (1) above, electrically connecting solar cells to other circuit conductors, such as series string termination leads and the leads of blocking and shunting diodes, presents a problem for the reason that conventional solar cell interconnects are often relatively thin, metallic, foil tabs, which cannot be welded or soldered reliably to such circuit conductors. This is due to the fact that since the circuit conductors are so massive compared to the cell interconnects the latter would melt before the more massive circuit conductors were heated to the proper welding or soldering temperature. One common method of solving this problem as it pertains to series string termination, for example, involves the use of metallic terminal strips mounted on the solar array substrate to which the solar cell interconnects are welded or soldered. Wire connectors in the form of stake-like solder pins are mounted on these terminal strips to provide terminal posts to which the external string terminal leads are joined. This type of solar panel circuitry has numerous disadvantages which need not be discussed here.

According to an improvement in this general type of solar panel terminal, the terminal strip is lanced and upset to provide loops through which electrical leads may be inserted and then welded or soldered to the connector strip. The solar cell interconnects are welded or soldered to this strip. The thermal coefficient of the connector strip is made to match that of the solar cells so as to avoid differential thermal expansion and contraction of the cells and terminal strip. This type of terminal strip, therefore, is ideally suited for use as a series string termination for a solar array but does not serve to alleviate the two remaining difficulties stated earlier, namely accommodating blocking and shunting diodes and achieving maximum solar cell packing density.

In this latter regard, it is common practice to equip a spacecraft solar array with series blocking and parallel shunting diodes to prevent major or total array failure in the event of an electrical short developing in a solar cell string, failure of a solar cell, and/or shadowing of a portion of the solar array. The manner in which such blocking and shunting diodes are arranged to accomplish these protective functions is well-known and need not be discussed here. Suffice it to say that incorporation of such diodes into a solar array has presented a problem with regard to mounting of the diodes. A variety of diode mounting arrangements are disclosed in the prior art.

U.S. Pat. No. 3,952,324, for example, discloses isolation or blocking diodes which have approximately the same size and shape as solar cells and are mounted on the front side of the solar array substrate along with the solar cells. A disadvantage of this diode mounting arrangement is that it requires specially designed diodes. U.S. Pat. No. 3,912,539 discloses combination solar cells and protective diodes whose size and shape also closely match those of conventional solar cells. Here again, this diode mounting arrangement has the disadvantage of requiring specially designed diodes. Other diodes mounting arrangements utilize conventional blocking and shunting diodes which are mounted on the back side of the solar array substrate. While this mounting arrangement permits the utilization of conventional diodes, it has the feature that the diodes are located at the rear of the substrate, which may be disadvantageous in at least some array applications and may render more difficult solar array assembly with the aid of automatic assembly tooling. This arrangement also substantially increases the number and length of the lead wires required and, thereby, the over-all weight of the solar panel.

Turning now to the solar cell packing density of a solar panel, it will be understood that maximum packing density provides maximum solar power output for a given panel size. Achieving such maximum packing density necessitates optimum utilization of the available solar array substrate area and permits any required solar array power output to be achieved with a smaller solar panel size and, hence, weight. In other cases, the available substrate area may be so limited as to render optimum utilization of the area absolutely essential in order to obtain the required solar array power output. Obviously, both of these cases are of significant interest in the field of spacecraft solar arrays.

SUMMARY OF THE INVENTION

This invention aids in alleviating all three of the solar array fabricating difficulties discussed above. To these ends, the invention provides a solar panel junction element which is designed to constitute a major component of the electrical circuit means for electrically connecting the panel solar cells into a solar electric power generating network. The junction element has an overall size and shape closely approximating the over-all size and shape of the individual solar cells of the array, whereby the element may be mounted on the solar panel substrate at any solar cell position on the substrate. Terminals are provided on the junction element for connection to selected solar cells and circuit conductors of the solar panel in such a way as to form a solar electric power generating network having the desired electrical characteristics. As discussed below, the junction element may be electrically arranged to function in this solar power generating network as a series string termination with or without blocking diodes, or as an electrical tap with or without blocking diodes, or as a mounting facility for shunting diodes. Also, a single solar array may, and generally will, embody a number of the present junction elements for two or all three of these functions.

In the case of a junction element of the invention for use as a series string termination, the element has solar cell and wire terminals which are electrically jointed to one another and arranged for connection to one end of a series string of solar cells and to a series string termination wire lead, either directly or through a blocking diode mounted on the junction element. Such a series string termination junction element may connect termination leads to the positive and negative ends of two adjacent series strings. Each string termination lead extends through aligned holes in the element and the solar panel substrate to the rear side of the panel for connection to external electrical circuitry. In the case of a junction element of the invention designed to function as an electrical tap, the element has a pair of solar cell terminals electrically joined to one another and to an intervening tap wire terminal, either directly or through blocking diodes mounted on the junction element. This tap wire terminal is adapted for connection to a tap wire lead which extends through holes in the element and substrate to the rear side of the solar panel for connection to external circuitry. Finally, in the case of a junction element designed to provide shunting diode protection for the solar array, the element has solar cell terminals which are electrically joined to one another and to wire terminals for connecting the terminal wires of one or more shunt diodes mounted on the junction element to the solar cell terminals and to shunt diode leads at the rear of the solar panel.

One advantage of the invention resides in the fact that a solar panel embodying the invention may be assembled using automatic assembly tooling. This tooling may include automatic welding or soldering equipment for welding or soldering the many solar cell interconnections and the electrical connections of the junction elements at a rapid rate with a high degree of uniformity and reliability. Another advantage of the invention is that the junction elements may be located at any selected solar cell position in the solar cell array. This enables solar panels to be tailor-made for different specific applications, with optimum utilization of the available solar panel area and, hence, maximum packing density of the solar cells. Moreover, in the event of a design change in a solar panel part way through its fabrication, the junction elements and solar cells may be simply rearranged to accommodate the design change.

DESCRIPTION OF THE PREFERRED EMBODIMENT

Figure 1:
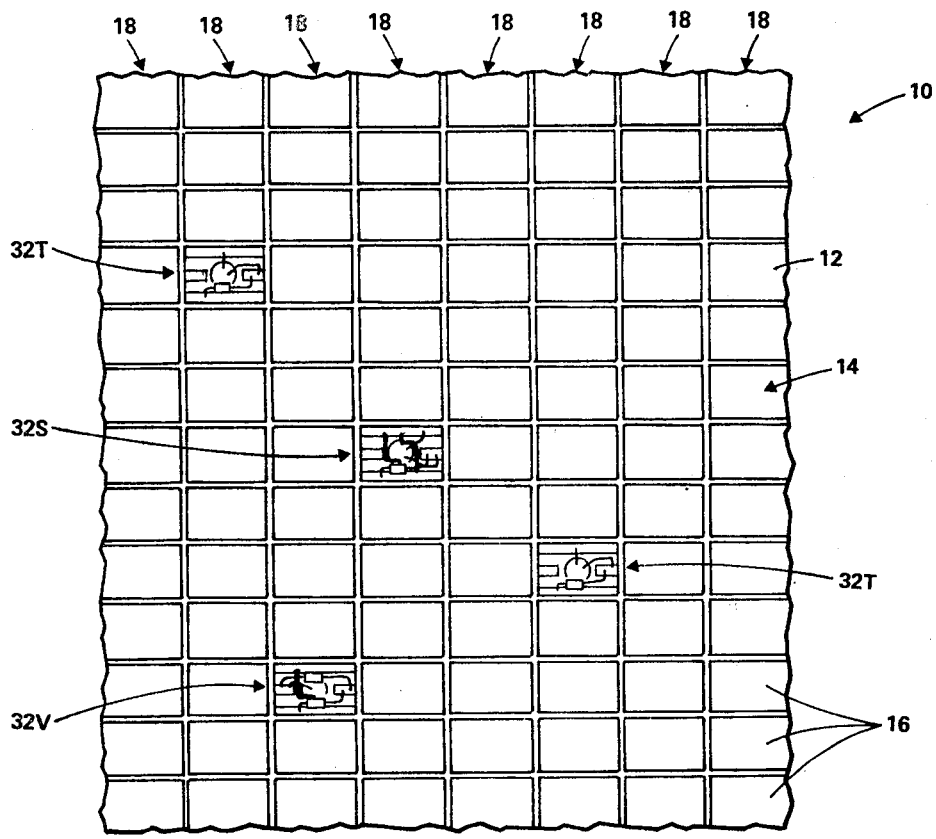
FIG. 1 is a front view of a solar array embodying junction elements according to the invention.

Turning now to the drawings, reference numeral 10 denotes a solar panel 10 according to the invention. As will appear from the ensuing description, the invention may be embodied in virtually any type of solar panel. The particular solar panel illustrated comprises a rigid panel having a rigid rear substrate 12 with a honeycomb core bonded between front and rear face sheets. Mounted on the front side of the substrate 12 is a rectangular array 14 of solar cells 16. Solar cells 16 are conventionally arranged in parallel rows 18 and adhesively bonded to the front side of the substrate 12.

The solar cells are electrically connected by circuit means 20 to form a solar electric power generating network 22. This solar electric power generating network of a typical spacecraft solar array comprises a plurality of so-called series strings 24 of solar cells each consisting of a number of the solar cells 16 connected in electrical series. These series cells strings are electrically connected in parallel to form series-parallel groups 26. The series-parallel groups, in turn, are electrically connected to the spacecraft power utilization and battery charging systems. Most, if not all, spacecraft solar array systems incorporate blocking diodes 28 connected in series at one end of each series string 24 and some have shunting diodes 30 connected in parallel with the cell strings to prevent total panel failure in the event of shadows or solar cell failures in the individual solar cell series strings.

According to the present invention, the circuit means 20 for electrically connecting the solar cells 16 into the solar electric power generating network 22 includes a number of junction elements which are designated generally by the reference numeral 32. Each junction element has an over-all size and shape closely approximating the size and shape of the individual solar cells 16 and is adapted to be mounted on the solar panel substrate 12 at any selected solar cell position on the substrate. As noted earlier and will be explained in more detail presently, the junction elements may be electrically arranged and connected in the power generating network 22 to serve any one of the following functions: (a) a solar cell series string termination with or without blocking diodes, (b) an electrical tap with or without blocking diodes, (c) a location or mount for shunting diodes.

Figure 3:
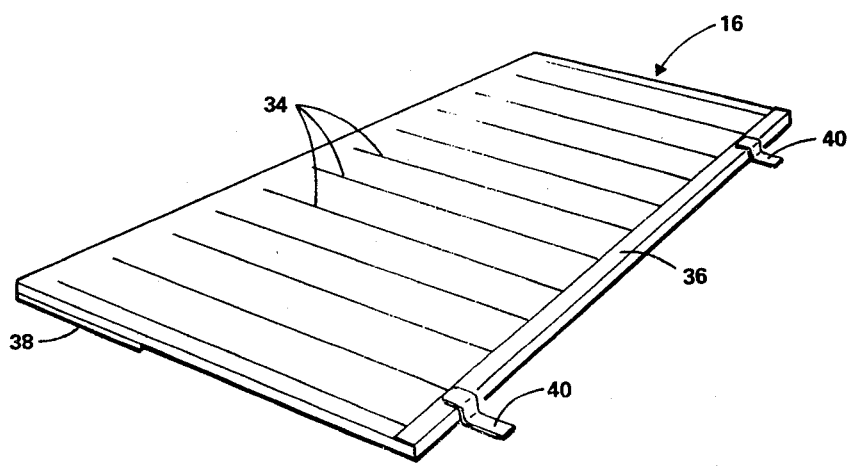
FIG. 3 is an enlarged perspective view of one solar cell of the array.

The illustrated solar array or solar panel 10 will now be described in greater detail by reference first to FIG. 3 illustrating on enlarged scale one of the solar cells 16 of the panel. This solar cell is conventional and, hence, need not be described in elaborate detail. Suffice it to say that the solar cell has a relatively thin, flat, rectangular shape and comprises a number of current collectors 34 extending across the front light-sensitive side of the cell unit 16 to a terminal strip 36 along one front edge of the cell. At the rear of the solar cell 16 along its opposite edge is a solder area 38 forming a rear electrical terminal of the cell. Extending from the cell terminal strip 36 are relatively thin, flexible, metallic tabs 40 which form cell interconnects.

Solar cells 16 are bonded to the substrate 12 and adjacent cells are electrically connected by their interconnects 40 in the conventional manner with the interconnects 40 of each cell welded or soldered to the rear terminals 38 of the adjacent cells to join the adjacent cells into the series strings 24 and adjacent strings are connected in parallel to form the cell groups 26. The cell interconnects are configured to be yieldable in such a way as to accommodate relative thermal expansion and contraction movements of the interconnected cells.

It will be understood that the solar cells 16 of a solar panel according to the invention are electrically arranged in a manner which will provide the panel with the required electrical characteristics and power requirements. Accordingly, the solar cell arrangement may vary from one solar panel to another. The particular solar cell arrangement shown in the drawings is intended merely to illustrate the various ways in which the junction elements 32 of this invention may be utilized.

Figure 2:
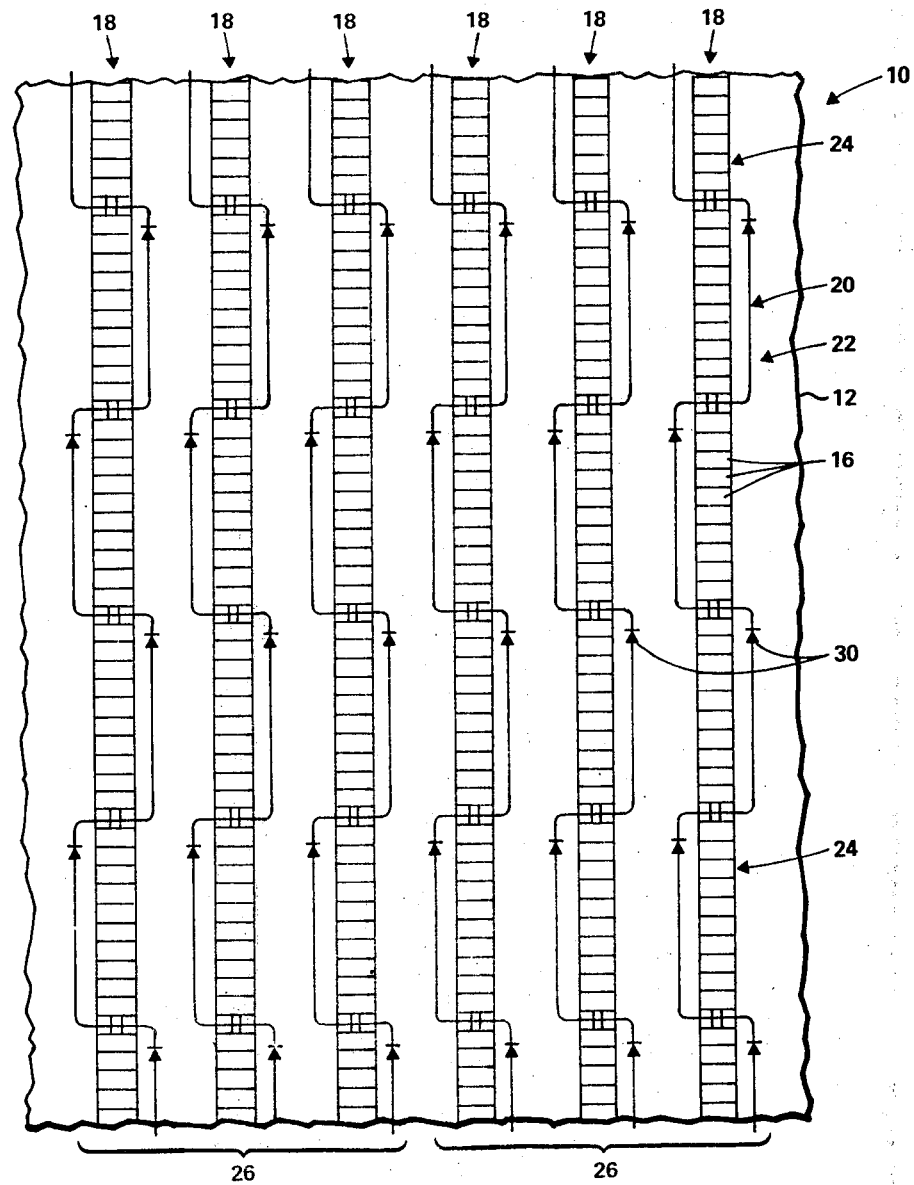
FIG. 2 is a circuit diagram of the array.

With the foregoing in mind, attention is directed to FIG. 2 illustrating the circuit diagram of the solar panel 10. As noted earlier and shown in the figure, the solar cells 16 are physically arranged in parallel rows 18 on the solar panel substrate 12. Groups of the cells in one or more of the rows are connected in electrical series to form the cell series strings 24. Groups of these series strings, in turn, are connected in electrical parallel to form the series-parallel string groups 26. The precise wiring arrangement of the circuit means 20 which thus electrically connects the cells in the required circuit arrangement to form the desired solar electric power generating network 22 is not part of this invention and need not be explained in detail. Suffice it to say that in a typical spacecraft solar panel, the solar array may be divided into a number of functional sections, such as a load section, a trickle charge section, and a full charge section, designed to provide electrical power for different functional purposes.

Figure 4:
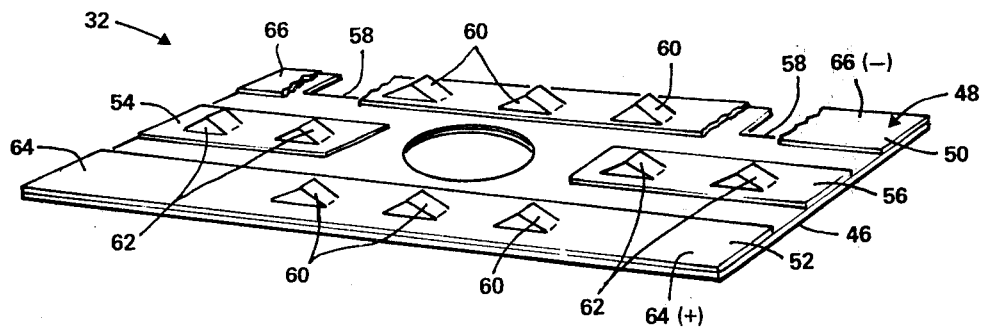
FIG. 4 is an enlarged perspective view of an unmounted junction element of the invention.

As discussed previously, the junction element 32 of this invention forms a major component of the solar panel circuit means 20 and may be arranged to serve as a series string termination with or without blocking diodes, or as a voltage tap with or without blocking diodes, or as a location or mount for shunt diodes. Moreover, a single junction element may serve only one, any two, or all three of these purposes. Turning to FIG. 4, the basic junction element 32 shown, which is typical of all those on the solar panel 10, will be seen to have a thin, rectangular shape and size closely approximating the shape and size of the individual solar cells 16. The body of the junction element comprises a thin, flat, rectangular, chip-like base member 46 of approximately the same length and breadth as the individual solar cells. This base member is constructed of a suitable electrical insulating material. Mounted on the base member 46 are electrical terminal means 48 which provide solar cell terminals for connection to the solar cell interconnects 40 and wire terminals for connection to lead wires of the solar panel circuit means 20.

In the particular junction element 32 shown, the terminal means 48 comprise two thin, flat, metallic terminal strips 50, 52 bonded to the normally front or top side of the base member 46 along its two longitudinal edges and two thin, flat, metallic terminal strips 54, 56 bonded to the front face of the base member between and generally parallel to the terminal edge strips 50, 52. Along the longitudinal edge of the base member 46 underlying the terminal strip 50 are a pair of rectangular cutouts or notches 58 through which rectangular portions of the terminal strip are exposed at the rear side of the base member. Each of the terminal strips 50, 52 is longitudinally lanced and upset to form between its ends a plurality, in this instance three, of upstanding, laterally opening loops 60. Similarly, each of the center terminal strips 54, 56 is longitudinally lanced and upset to form on the strip a plurality, in this instance two, of upstanding, laterally opening loops 62. These terminal strip loops 60, 62 provide wire terminals through which lead wires of the solar panel circuit means 20 may be inserted and then soldered or welded to the respective terminal strips. For this reason, the loops 60, 62 are hereinafter referred to as wire terminals. The end portions 64 of the terminal strip 52 provide front solar cell terminals. The rectangular portions 66 of the terminal strip 50 which are exposed through the base member notches 58 provide rear solar cell terminals. From this description, it will be understood that the wire terminals 60 on the terminal strip 52 are electrically joined to the front solar cell terminals 64. The wire terminals 60 on the terminal strip 50 are electrically joined to the rear solar cell terminals 66. As will be explained presently, the solar cell terminals 64, 66 are adapted for connection to the rear terminals 38 and front terminals 36, respectively, of the solar cells 16.

Each junction element 32 of the solar panel 10 is mounted on the panel substrate 12 by adhesively bonding the base member 46 of the junction element to the substrate. To this end, each junction element may have stripes of thermosetting adhesive applied to the rear face of its base member 46 for adhesive bonding of the base member to the substrate in the manner explained later.

Figure 5:
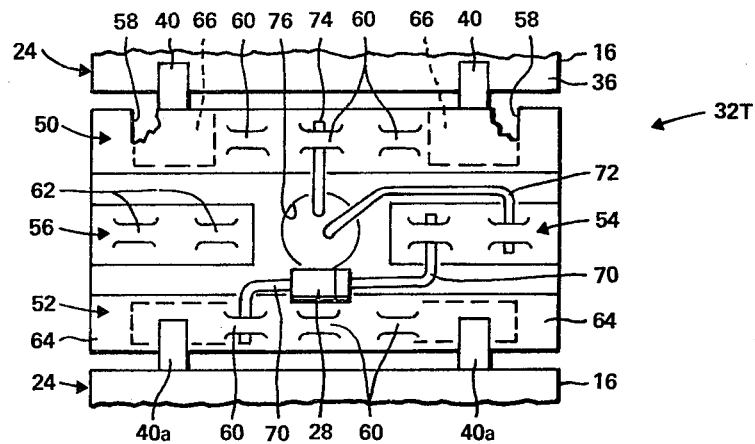
FIG. 5 is an enlarged front view of a junction element of the invention arranged to provide a series string termination.

In FIG. 5, reference numeral 32T denotes a junction element of the invention which provides a termination with a blocking diode 28 for two adjacent series strings 24. In this case, the junction element is mounted between the strings and hence adjacent the positive end of one string and the negative end of the other string. The positive end of the one string is connected by interconnects 40a like the interconnects 40 to the front solar cell terminals 64 on the junction element. The negative end of the other string is connected by the adjacent solar cell interconnects 40 to the rear solar cell terminals 66 of the junction element. The blocking diode 28 extends between and has its wire terminals 70 joined to one wire terminal 60 of the terminal strip 52 and one wire terminal 62 of the center terminal strip 54 on the junction element. Termination leads 72, 74 are joined to the other wire terminal 62 of the terminal strip 54 and to a wire terminal 60 on the terminal strip 50 of the junction element. These termination leads extend through aligned holes 76 in the junction element and the solar panel substrate 12 to the rear side of the panel for connection to the remainder of the panel circuit means 20.

As noted earlier, an advantage of the invention resides in the fact that, because of its similar size and shape to the individual solar cells 16, the junction element 32 may be located in any selected solar cell position in the solar cell array 14. In this regard, it will be understood that while the termination junction element just described provides positive and negative terminations for two adjacent series strings 24, a junction element may be utilized as either a positive termination only or a negative termination only for a single series string. It will be understood that when utilized as a positive termination for a single series string, the junction element is located at the positive end of the string which is connected to the front solar cell terminals 64 of the junction element by the adjacent solar cell interconnects 40, the termination lead 72 is retained, and the termination lead 74 is eliminated. Similarly, when utilized as a negative termination for a single series string, the junction element is located at the negative end of the string which is connected to the rear solar cell terminals 66 of the junction element by the adjacent solar cell interconnects 40, the termination lead 74 is retained, the blocking diode 28 and termination lead 72 are eliminated. It will be further understood that when a junction is utilized as either a positive termination only or both a positive and negative termination, the blocking diode 28 may be eliminated if not needed. In this case, the termination lead 72 is connected directly to one of the wire terminals 60 on the terminal strip 52.

A positive termination or a combination positive and negative termination may embody a pair of blocking diodes 28 in series. In this case the arrangement of the junction element 32T is identical to that illustrated in FIG. 5 except that the termination lead 72 is connected to a wire terminal 62 of the center terminal strip 56 and a second blocking diode 28 is connected in bridging relation between remaining wire terminals 62 of the two center terminal strips 54, 56. A circuit may then be traced from the terminal strip 52 of the junction element through the two blocking diodes 28 in series to the termination lead 72.

Figure 6:
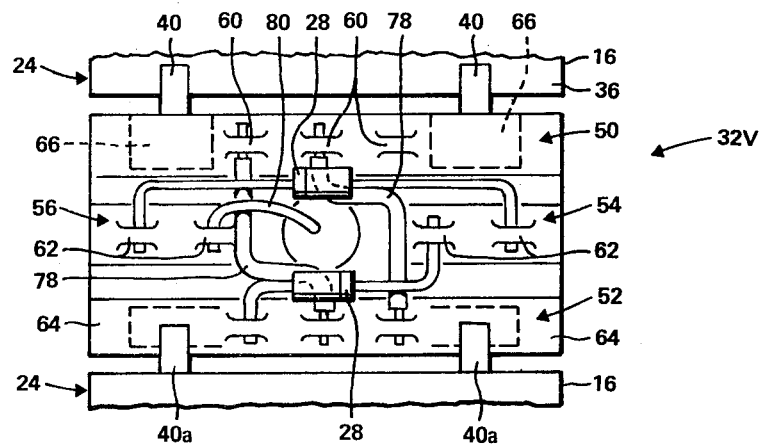
FIG. 6 is a view similar to FIG. 4 of a junction element arranged to provide a voltage tap.

In FIG. 6, reference numeral 32V denotes a junction element according to the invention which is arranged to provide a voltage tap. In this case, the junction element is located between two adjacent solar cells 16, either within a single series string 24 or, more commonly, between two adjacent strings. The solar cell terminals 64, 66 on the junction element are connected by interconnects 40, 40a to the adjacent solar cell interconnects, as before. At least one lead 78, and two leads in the case of the illustrated voltage tap junction element, are connected between wire terminals 60 of the terminal strips 50, 52, as shown. These leads connect the adjacent solar cells 16 or cell strings 24 in electrical series. One of the terminal strips 50, 52 is connected, either directly or through one or two blocking diodes, to a voltage tap lead 80 which extends through the aligned holes 76 in the junction element and the solar panel substrate 12 to the rear of the panel for connection to the remainder of the solar panel circuit means 20. In the particular voltage tap junction element illustrated, for example, the tap lead 80 is connected to the terminal strip 52 through a pair of blocking diodes 28 arranged in electrical series. One of these blocking diodes is connected between a wire terminal 60 of the terminal strip 52 and a wire terminal 62 on the center terminal strip 54. The second blocking diode 28 is connected between the remaining wire terminal 62 on the terminal strip 54 and one wire terminal 62 on the other center terminal strip 56. The tap lead 80 is connected to the remaining wire terminal 62 on the latter terminal strip. If the second blocking diode is eliminated, the tap terminal 80 will be connected to the terminal strip 54. If both blocking diodes are eliminated, the tap lead may be connected to either the terminal strip 50 or the terminal strip 52.

Figure 7:
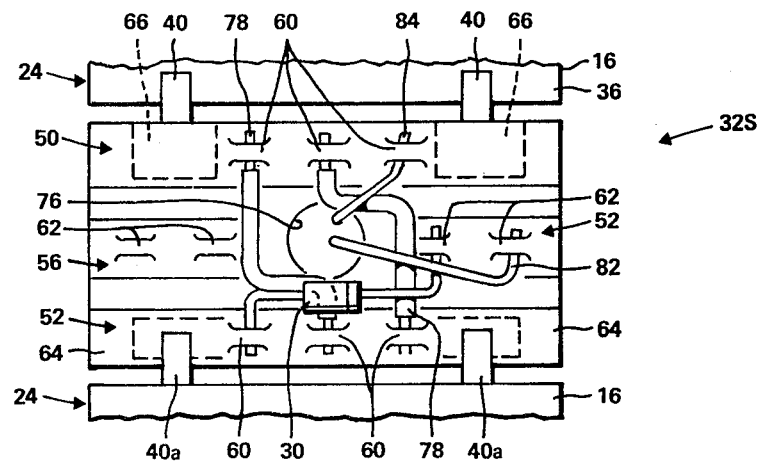
FIG. 7 is a similar view of a junction element arranged to provide a shunt diode mounting.

In FIG. 7, reference numeral 32S denotes a junction element 32 according to the invention which provides a mount or location for a shunt diode 30. The particular shunt diode junction element illustrated has but a single shunt diode but it may embody a pair of shunt diodes connected in series in the same manner as the two blocking diodes 28 in the illustrated voltage tap junction element of FIG. 6. The shunt diode 30 is connected between terminal strips 52, 54 or the junction element as shown in FIG. 7 and lead wires 82, 84 are connected between adjacent junction elements in a manner such that a shunt diode is connected in shunt relation to each cell string 24, as shown in FIG. 2.

Figure 8:
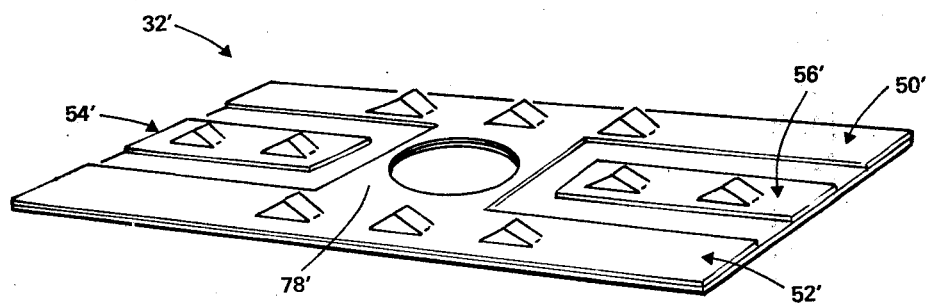
FIG. 8 is an enlarged perspective view of a modified junction element of the invention.

The junction elements 32 described thus far require wire leads, such as leads 78, for interconnecting the various junction terminal strips 50, 52, 54, 56 as necessary for the particular junction element application at hand. The modified junction element 32 illustrated in FIG. 8 eliminates the need for such interconnecting leads by providing the junction element with integral interconnecting or bridging strips between the terminal strips to be interconnected. In the particular junction element 32' shown, for example, the two edge terminal strips 50', 52' are integrally joined by an interconnecting or bridging strip 78' which performs the function of, and thus eliminates the need for, the interconnecting leads 78 in FIGS. 6 and 7. Obviously, any two or more of the terminal strips 50', 52', 54', 56' on the modified junction element 32' may be joined in this way. The conductive portions, i.e. terminal strips and interconnecting strip(s), of this modified junction element may be formed by stamping, printed circuit, or any other suitable fabricating technique.

We claim:
1. A solar panel comprising:
a substrate,
an array of solar cells mounted on said substrate,
circuit means electrically connecting said solar cells to form a solar electric power generating network, and
said circuit means comprising interconnect means on said solar cells, lead wires, and a junction element mounted on said substrate within said cell array including an electrically insulating base member having an over-all size and shape approximately the size and shape of the individual solar cells whereby said junction element may occupy any solar cell position in said array, terminal means on said base member including a solar cell terminal electrically connected to interconnect means of a selected solar cell of said array and a wire terminal connected to a selected lead wire of said circuit means, and means on said base member electrically connecting said cell terminal and wire terminal.

2. The solar panel of claim 1 wherein:
said selected lead wire extends from said wire terminal to the rear side of said substrate through aligned holes in said substrate and base member.

3. The solar panel of claim 1 wherein:
said solar cells and junction element base member have similar thin, flat, rectangular shapes.

4. The solar panel of claim 1 wherein:
said terminal means comprises relatively thin, metallic terminal strip means on said base member including a first strip portion along one edge of said base member forming said solar cell terminal and a second strip portion forming said wire terminal and having an upwardly arching loop receiving said selected lead wire.

5. The solar panel of claim 4 wherein:
said terminal strip means comprises a thin, metallic terminal strip on said base member providing both said first strip portion which forms said solar cell terminal and said second strip portion which forms said wire terminal, and said connecting means comprises the intervening portion of said terminal strip.

6. The solar panel of claim 4 wherein:

said terminal strip means comprises first and second spaced, thin, metallic terminal strips on said base member providing, respectively, said first strip portion which forms said solar cell terminal and said second strip portion which forms said wire terminal, and said connecting means connects said terminal strips.

7. The solar panel of claim 6 wherein:
said connecting means comprises diode means having terminal wires, and said terminal strips have upwardly arching loops receiving and joined to said terminal wires, respectively, of said diode means.

8. The solar panel of claim 4 wherein:
said terminal strip means comprises first, second and third spaced, thin, metallic terminal strips on said base member providing, respectively, said first strip portion which forms said solar cell terminal, said second strip portion which forms said wire terminal, and second solar cell terminal connected to interconnect means of a second selected solar cell, and said connecting means connects said first and second terminal strips,
said third terminal strip is located along the opposite edge of said base member, and
said junction element further comprises additional connecting means electrically joining said first and third terminal strips.

9. The solar panel of claim 8 wherein:
said additional connecting means comprises a lead wire, and said first and third terminal strips have upwardly arching loops receiving and joined to the ends of said latter lead wire.

10. The solar panel of claim 8 wherein:
said additional connecting means comprises a thin, metallic strip joining and integral with said first and third terminal strips.

11. The solar panel of claim 8 wherein:
said first mentioned connecting means comprises diode means having terminal wires, and said first and second terminal strips have upwardly arching loops receiving and joined to said terminal wires, respectively, of said diode means.

12. The solar panel of claim 8 wherein:
said terminal strip means comprises a fourth terminal strip on said base member spaced from the other terminal strips, and
said first mentioned connecting means comprises a first diode extending between said first and second terminal strips, and a second diode extending between said second and fourth terminal strips, said diodes having terminal wires and said first, second and fourth terminal strips having upwardly arching loops receiving and joined to the respective diode terminal wires.

13. The solar panel of claim 4 wherein:
said terminal strip means comprises first, second and third spaced, thin, metallic terminal strips on said base member providing, respectively, said first strip portion which forms said solar cell terminal, said second strip portion which forms said wire terminal, and a second solar cell terminal connected to interconnect means of a second selected solar cell, and said connecting means connects said first and second terminal strips,
said third terminal strip is located along the opposite edge of said edge member, and
said circuit means includes a second lead wire connected to said third terminal strip.

14. A solar panel comprising:
a substrate,
an array of solar cells mounted on said substrate in parallel rows,
circuit means electrically connecting said solar cells to form a solar electric power generating network including solar cell strings each including a multiplicity of solar cells connected in electrical series,
said circuit means comprising interconnect means on said solar cells, a cell string termination lead wire, and a cell string termination junction element mounted on said substrate at one end of a selected cell string including a base member having an over-all size and shape approximating the size and shape of the individual solar cells, whereby said junction element may occupy a solar cell position at either end of any cell string in said array, terminal means on said base member including a solar cell terminal electrically connected to the cell interconnect means at the adjacent end of said selected cell string, a wire terminal connected to said cell string termination lead, means electrically connecting said cell terminal and wire terminal, and
said string termination lead extending from said wire terminal to the rear of said solar panel through aligned holes in said substrate and base member.

15. The solar panel of claim 14 wherein:
said connecting means comprises a blocking diode.

16. The solar panel of claim 15 wherein:
said junction element is located between said selected cell string and a second cell string,
said terminal means includes a solar cell terminal electrically connected to the cell interconnect means at the adjacent end of said second cell string, and
said circuit means comprising a second string termination lead connected to said second solar cell terminal and extending to the rear of said panel through said aligned holes.

17. The solar panel of claim 16 wherein:
said connecting means comprises a blocking diode having terminal wires, and
said solar cell and wire terminals comprise thin, metallic, terminal strips on said base member having upwardly arching loops receiving and joined to said lead and terminal wires, respectively.

18. The solar panel of claim 14 wherein:
said connecting means comprises a blocking diode having terminal wires, and
said solar cell and wire terminals comprise thin, metallic, terminal strips on said base member having upwardly arching loops receiving and joined to said lead and terminal wires, respectively.

19. A solar panel, comprising:
a substrate,
an array of solar cells mounted on said substrate in parallel rows,
circuit means electrically connecting said solar cells to form a solar electric power generating network including solar cell strings each including a multiplicity of solar cells connected in electrical series,
said circuit means comprising interconnect means on said solar cells, a voltage tap lead wire, and a voltage tap junction element mounted in one of said cell rows between two adjacent solar cells including a base member having an over-all size and shape approximating the size and shape of the individual solar cells, whereby said junction element may occupy a solar cell position in any of said cell rows, terminal means on said base member including solar cell terminals electrically connected to the interconnect means on the adjacent solar cells, respectively, a wire terminal connected to said voltage tap lead wire, means electrically joining said cell and wire terminals, and said voltage tap lead wire extending from said wire terminal to the rear of said solar panel through aligned holes in said substrate and base member.

20. The solar panel of claim 19 wherein:

said connecting means comprises a connecting wire joining said solar cell terminals and a blocking diode joining said wire terminal and one solar cell terminal and having terminal wires, and said solar cell and wire terminals comprise thin metallic strips on said base member having upwardly arching loops receiving and joined to said connecting terminal and voltage tap wires.

21. A solar panel comprising:

a substrate, an array of solar cells mounted on said substrate in parallel rows, circuit means electrically connecting said solar cells to form a solar electric power generating network including solar cell strings each including a multiplicity of solar cells connected in electrical series, said circuit means comprising interconnect means on said solar cells, a shunt lead wire electrically shunting a cell string, and a shunt junction element mounted in one of said cell rows between two adjacent solar cells including a base member having an over-all size and shape approximating the size and shape of the individual solar cells, whereby said junction element may occupy a solar cell position in any of said cell rows, terminal means on said base member including solar cell terminals electrically connected to the interconnect means on the adjacent solar cells, respectively, a wire terminal connected to said lead wire, a shunt diode electrically joining one cell terminal and said wire terminal, and said lead wire extending from said wire terminal to the rear of said solar panel through aligned holes in said substrate and base member.

22. A junction element for a solar array having solar cells mounted on a substrate, comprising: a relatively thin, flat, rectangular dielectric base member adapted to be mounted on said substrate at any solar cell position in said array and having a normally upper surface;

relatively thin metallic terminal strip means secured to said upper surface of said base member and having upwardly arching looplike terminals adapted to receive wires, wherein said terminal strip means comprises a first strip portion along one edge of said base member and a second strip portion along the opposite edge of said base member, each having at least one of said looplike terminals, said terminal strip means further comprising an intervening strip portion joining said first and second strip portions.

23. The junction element of claim 22 wherein:

said base member has a hole spaced from said terminal strip means.

24. The junction element of claim 22 wherein:

said terminal strip means comprises at least one additional terminal strip between and isolated from said first and second strip portions and having at least one of said wire terminals.

25. The junction element of claim 22 wherein:

said junction element comprises diode means having terminal wires, and said terminal strip means comprises a pair of spaced terminal strips having said wire terminals receiving and joined to said terminal wires, respectively, of said diode means.

26. The junction element of claim 22 wherein:

said junction element comprises a lead wire, and said terminal strip means comprises a pair of terminal strips having said wire terminals receiving and joined to the ends of said lead wire.

27. A junction element for a solar array having a solar cells mounted on a substrate, comprising:

a relatively thin, flat, rectangular, dielectric base member having a normally upper surface, a pair of thin, flat, metallic edge terminal strips on said base member along two parallel edges, respectively, of said base member, at least one intermediate thin, flat, metallic terminal strip on said base member between said edge strips, and said terminal strip having upwardly arching looplike terminals adapted to receive wires, and said edge terminal strips having exposed planar portions forming solar cell terminals.

28. The junction element of claim 27 wherein:

said element has a pair of said intermediate terminal strips.

29. The junction element of claim 27 wherein:

said base member has a hole.

30. The junction element of claim 27 including:

interconnecting strip means on said base member integral with and joining selected terminal strips.

* * * * *